United States Patent
Babitch

(10) Patent No.: US 7,466,209 B2
(45) Date of Patent: Dec. 16, 2008

(54) SYSTEM AND METHOD FOR PROVIDING TEMPERATURE CORRECTION IN A CRYSTAL OSCILLATOR

(75) Inventor: Daniel Babitch, San Jose, CA (US)

(73) Assignee: SiRF Technology, Inc., San Jose, CA (US)

( * ) Notice: Subject to any disclaimer, the term of this patent is extended or adjusted under 35 U.S.C. 154(b) by 156 days.

(21) Appl. No.: 11/620,643

(22) Filed: Jan. 5, 2007

(65) Prior Publication Data

US 2008/0164952 A1     Jul. 10, 2008

(51) Int. Cl.
  H03B 5/04     (2006.01)
  H03B 5/36     (2006.01)
  H03L 1/02     (2006.01)
(52) U.S. Cl. ........................................ 331/66; 331/158
(58) Field of Classification Search .................. 331/65, 331/66, 68–70, 158, 175, 176
See application file for complete search history.

(56) References Cited

U.S. PATENT DOCUMENTS

| | | | |
|---|---|---|---|
| 5,663,734 A | 9/1997 | Krasner |
| 5,663,735 A | 9/1997 | Eshenbach |
| 5,781,156 A | 7/1998 | Krasner |
| 5,812,087 A | 9/1998 | Krasner |
| 5,825,327 A | 10/1998 | Krasner |
| 5,831,574 A | 11/1998 | Krasner |
| 5,841,396 A | 11/1998 | Krasner |
| 5,874,914 A | 2/1999 | Krasner |
| 5,884,214 A | 3/1999 | Krasner |
| 5,945,944 A | 8/1999 | Krasner |
| 5,999,124 A | 12/1999 | Sheynblat |
| 6,002,363 A | 12/1999 | Krasner |
| 6,016,119 A | 1/2000 | Krasner |
| 6,052,081 A | 4/2000 | Krasner |
| 6,061,018 A | 5/2000 | Sheynblat |
| 6,064,336 A | 5/2000 | Krasner |
| 6,104,338 A | 8/2000 | Krasner |
| 6,104,340 A | 8/2000 | Krasner |
| 6,107,960 A | 8/2000 | Krasner |
| 6,111,540 A | 8/2000 | Krasner |
| 6,131,067 A | 10/2000 | Girerd |
| 6,133,871 A | 10/2000 | Krasner |
| 6,133,873 A | 10/2000 | Krasner |
| 6,133,874 A | 10/2000 | Krasner |
| 6,150,980 A | 11/2000 | Krasner |

(Continued)

OTHER PUBLICATIONS

Marketing Material: Qualcomm CDMA Technologies—Integrated Solutions—MGP6200™ Multimode GPS Processor (8 pages).

(Continued)

*Primary Examiner*—David Mis
(74) *Attorney, Agent, or Firm*—The Eclipse Group

(57) ABSTRACT

A system and method for providing temperature compensation in a oscillator component (such as a crystal oscillator component) that includes a closely-located temperature sensing device. The crystal oscillator component in example systems and methods is exposed to a temperature profile during a calibration procedure. Temperature and frequency data are collected and applied to coefficient generating function according to a temperature compensation model to generate a set of coefficients that are used in the temperature compensation model in an application device. The generated coefficients are stored in a coefficient memory accessible to an application device during operation.

27 Claims, 11 Drawing Sheets

U.S. PATENT DOCUMENTS

| | | |
|---|---|---|
| 6,185,427 B1 | 2/2001 | Krasner |
| 6,208,290 B1 | 3/2001 | Krasner |
| 6,208,291 B1 | 3/2001 | Krasner |
| 6,215,441 B1 | 4/2001 | Moeglein |
| 6,215,442 B1 | 4/2001 | Sheynblat |
| 6,236,354 B1 | 5/2001 | Krasner |
| 6,239,742 B1 | 5/2001 | Krasner |
| 6,259,399 B1 | 7/2001 | Krasner |
| 6,272,430 B1 | 8/2001 | Krasner |
| 6,289,041 B1 | 9/2001 | Krasner |
| 6,307,504 B1 | 10/2001 | Sheynblat |
| 6,313,786 B1 | 11/2001 | Sheynblat |
| 6,314,308 B1 | 11/2001 | Sheynblat |
| 6,377,209 B1 | 4/2002 | Krasner |
| 6,408,196 B2 | 6/2002 | Sheynblat |
| 6,411,254 B1 | 6/2002 | Moeglein |
| 6,411,892 B1 | 6/2002 | Van Diggelen |
| 6,417,801 B1 | 7/2002 | Van Diggelen |
| 6,421,002 B2 | 7/2002 | Krasner |
| 6,429,814 B1 | 8/2002 | Van Diggelen et al. |
| 6,433,731 B1 | 8/2002 | Sheynblat |
| 6,453,237 B1 | 9/2002 | Fuchs et al. |
| 6,484,097 B2 | 11/2002 | Fuchs et al. |
| 6,487,499 B1 | 11/2002 | Fuchs et al. |
| 6,510,387 B2 | 1/2003 | Fuchs et al. |
| 6,542,821 B2 | 4/2003 | Krasner |
| 6,583,757 B2 | 6/2003 | Krasner |
| 6,597,311 B2 | 7/2003 | Sheynblat |
| 2008/0100392 A1* | 5/2008 | Pernia et al. ................ 331/173 |

OTHER PUBLICATIONS

Marketing Material: uNav Microelectronics—uN9x18 Low Power, High Performance GPS Receiver Chipset/uN9x18 GPS Receiver Solution (9 pages).

Marketing Material: uNav Microelectronics, uN9x18 Low Power, High Performance GPS Receiver Chipset (2 pages).

Marketing Material: Global Locate—Hammerhead II™, Single Chip AGPS Solution (2 pages).

Marketing Material/Press Release: Broadcom Introduces Advanced Single-Chip GPS Solution for Mobile Applications (3 pages).

Marketing Material/White Paper: Snap Track: A Qualcomm Company—Snap Track's Wireless Assisted GPS™ (A-GPS) Solution Provides the Industry's Best Location System—Location Technologies for GSM, GPRS, and WCDMA Networks (Qualcomm CDMA Technologies: Enabling the Future of Communications) (4 pages).

* cited by examiner

SYSTEM AND METHOD FOR PROVIDING TEMPERATURE CORRECTION IN A CRYSTAL OSCILLATOR

BACKGROUND OF THE INVENTION

1. Field of the Invention

The present invention relates to electronic components and more particularly to providing compensation for environmental effects on operation of oscillators.

2. Description of Related Art

Crystal oscillators, which are components in electronic systems that are widely used to generate fixed frequency signals, are known to be affected by environmental conditions, such as temperature. In general, the frequency generated by a crystal oscillator may vary as the temperature around it changes. The applications in which such crystal oscillators are used may not tolerate much variation in the frequency. Several methods have been developed to stabilize their frequency. Some examples include:

1. Having the crystal oscillator operate in a controlled temperature environment. Such crystal oscillators are generally known as an oven controlled crystal oscillator (OCXO).
2. Combining the crystal oscillator circuit with analog circuits, which include components that have temperature-sensitive reactances and the components are arranged to compensate the frequency vs. temperature characteristic. Such crystal oscillators are called temperature compensated crystal oscillators (TCXO).
3. Using crystal oscillators that have values of frequency vs. temperature characteristics stored in digital memory. The values may be stored and used as an interpolated look-up table by a specialized hardware circuit to correct the output frequency of the oscillator. In order to know which value to access in the look-up table, an analog to digital converter (A/D) is used to measure the value of a temperature sensor. This is also known as a microprocessor compensated crystal oscillator (MCXO) or Digitally Compensated Crystal Oscillator (DCXO.)
4. Storing coefficients, such as polynomial coefficients, that are used to generate curves that match the frequency vs. temperature characteristic, in a digital memory inside the crystal oscillator. In this case, the functional nature of the curves is predefined. For example, a correction equation Correction=$k*T^3$ may be used. That is, some constant coefficient k times the cube of the temperature, and the coefficient k is calculated and stored by the manufacturer in digital memory. As in the MCXO above, a temperature sensor is digitized and used with the stored coefficient to calculate a frequency correction which is applied to specialized hardware to correct the frequency. Usually several coefficients are used for a realistic curve fit.
5. Using a crystal that vibrates in two modes at the same time, one mode being relatively stable and the other mode being highly temperature-sensitive, such that it serves as a temperature sensor by measuring the oscillation frequency with moderate precision relative to the first oscillation mode. Then the difference between the two frequencies may be used to generate a correction factor.
6. Using two crystals in one package, where one crystal being the unit to be compensated, and the other crystal being one having a linear frequency versus temperature characteristic so that the second crystal acts as a temperature sensor for the first crystal. In this case, the frequency of the sensor can provide temperature information which may then be used to correct the first crystal frequency if the correction required is previously measured and known. This is similar to no. 5 above, except the use of two crystals isolate some problems of frequency cross-coupling in a dual-mode device.

The above-described methods rely on a static curve model for temperature dependence. This means the models assume there is a frequency vs. temperature relation that does not change for a given crystal unit and does not depend on how fast the temperature is changing. It is well known in the art that this assumption begins to fail with increasing error when the temperature rate of change increases from zero.

There is a need for improved systems and methods for stabilizing crystal oscillator operation.

SUMMARY

In view of the above, systems and methods are provided for configuring a crystal oscillator component where the crystal oscillator component includes a temperature sensor. The crystal oscillator component may be configured by first exposing the crystal oscillator component to a controlled temperature environment. The crystal oscillator component is enabled for operation so that the crystal oscillator component outputs a frequency signal while initiating a temperature test profile in the controlled temperature environment. The temperature at the crystal oscillator component is set to a first initial temperature and varied according to the profile. During the temperature profile, the frequency and temperature are periodically measured as the temperature setting changes. The measured frequency and temperature data is applied to a temperature compensation model to generate a plurality of parameters that characterize the crystal oscillator component. The parameters include dynamic response parameters that characterize a thermal dynamic response of the crystal oscillator component. The generated parameters are then associated with the crystal oscillator component.

Various advantages, aspects and novel features of the present invention, as well as details of an illustrated embodiment thereof, will be more fully understood from the following description and drawings.

Other systems, methods and features of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood with reference to the following figures. The components in the figures are not necessarily to scale, emphasis instead being placed upon illustrating the principles of the invention. In the figures, like reference numerals designate corresponding parts throughout the different views.

DETAILED DESCRIPTION

In the following description of preferred embodiments, reference is made to the accompanying drawings that form a part hereof, and which show, by way of illustration, specific embodiments in which the invention may be practiced. Other embodiments may be utilized and structural changes may be made without departing from the scope of the present invention.

1. Examples of Systems for Temperature Compensating a Crystal Oscillator Circuit.

Examples of systems for temperature compensating a crystal oscillator circuit consistent with the present invention are described below with reference to FIGS. 1 through 4. In the examples described below, a temperature-sensing device is advantageously closely located with a device (i.e. the crystal oscillator circuit) that is to be compensated. The proximity of the temperature-sensing advantageously improves the accuracy of the compensation. FIGS. 1-4 illustrate "use models" for implementation of a crystal oscillator circuit having temperature-sensing and temperature-compensating capabilities. That is, the use models illustrate the implementation of the crystal oscillators in application devices, such as GPS receivers, for just one example. Those of ordinary skill in the art will appreciate that while examples described herein relate to crystal oscillators, example systems and methods consistent with the present invention may be applicable to silicon-based oscillators, or other types of oscillators.

Figure 1:
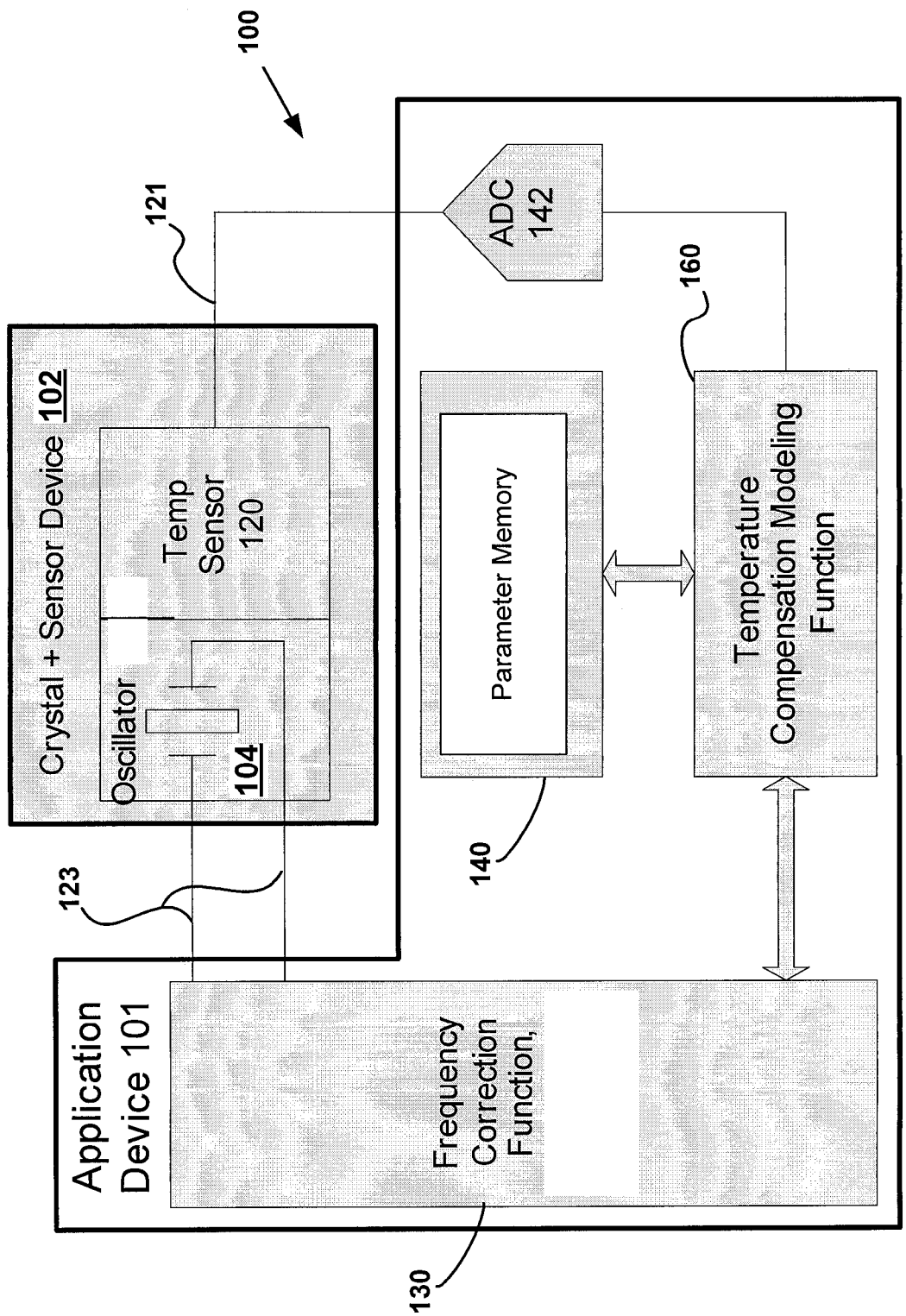
FIG. 1 is a block diagram of one example of a device that performs functions that use a signal having a frequency generated by a temperature compensated crystal oscillator circuit.

FIG. 1 is a block diagram of a first use model 100 in which a crystal oscillator circuit 102 generates a frequency for use by an application device 101. The crystal oscillator circuit 102 includes a crystal oscillator 104 and a temperature sensor 120 built into a crystal oscillator circuit package 102. The temperature sensor 120 may be a Proportional To Absolute Temperature ("PTAT") sensor (also known as a bandgap sensor), or a suitable alternative. The crystal oscillator 104 may be of a temperature compensating cut such as AT cut.

The application device 101 includes an analog to digital converter ("ADC") 142, a temperature compensation modeling function 160, a parameter memory 140 and a frequency correction function 130 in addition to other hardware and software for performing the functions designated for the application device 101. The ADC 142 receives a voltage signal at 121 and converts the signal to a digital value that represents the temperature of the crystal oscillator 104. The voltage signal at 121 is proportional to the temperature of the crystal oscillator 104. The digital value representing the temperature of the crystal oscillator 104 is input to the temperature compensation modeling function 160.

The parameter memory 140 in the application device 101 is used to store a plurality of parameters that characterize the crystal oscillator component, the parameters including dynamic response parameters that characterize a thermal dynamic response of the crystal oscillator component. The parameter memory 140 may be a designated storage space, such as a set of registers provided in hardware specifically to contain the parameters; or the parameters and other data. The parameter memory 140 may also be implemented in system memory used by the application device 101 to store data and/or programmed functions. The temperature compensation modeling function 160 retrieves the parameters from the parameter memory 140 and uses the parameters and the ADC output to calculate a frequency correction. The frequency correction function 130 applies the frequency correction to the output of the crystal oscillator circuit 102 at 123. The frequency correction function 130 may be implemented in hardware or in software to provide the application device 101 with a more accurate knowledge of the crystal frequency.

In one example of a temperature compensation model, the parameters stored in parameter memory 140 include coefficients of terms related to temperature readings in a model that yields information about a temperature-related frequency error. The example temperature compensation model advantageously includes coefficients that characterize a thermal dynamic response of the component. The parameter memory 140 may include the coefficients and other data related to application of the model to the component. In other examples, the parameter memory 140 may include other types of parameters that may be used in a temperature compensation model that is capable of characterizing the thermal dynamic response of the component.

Figure 2:
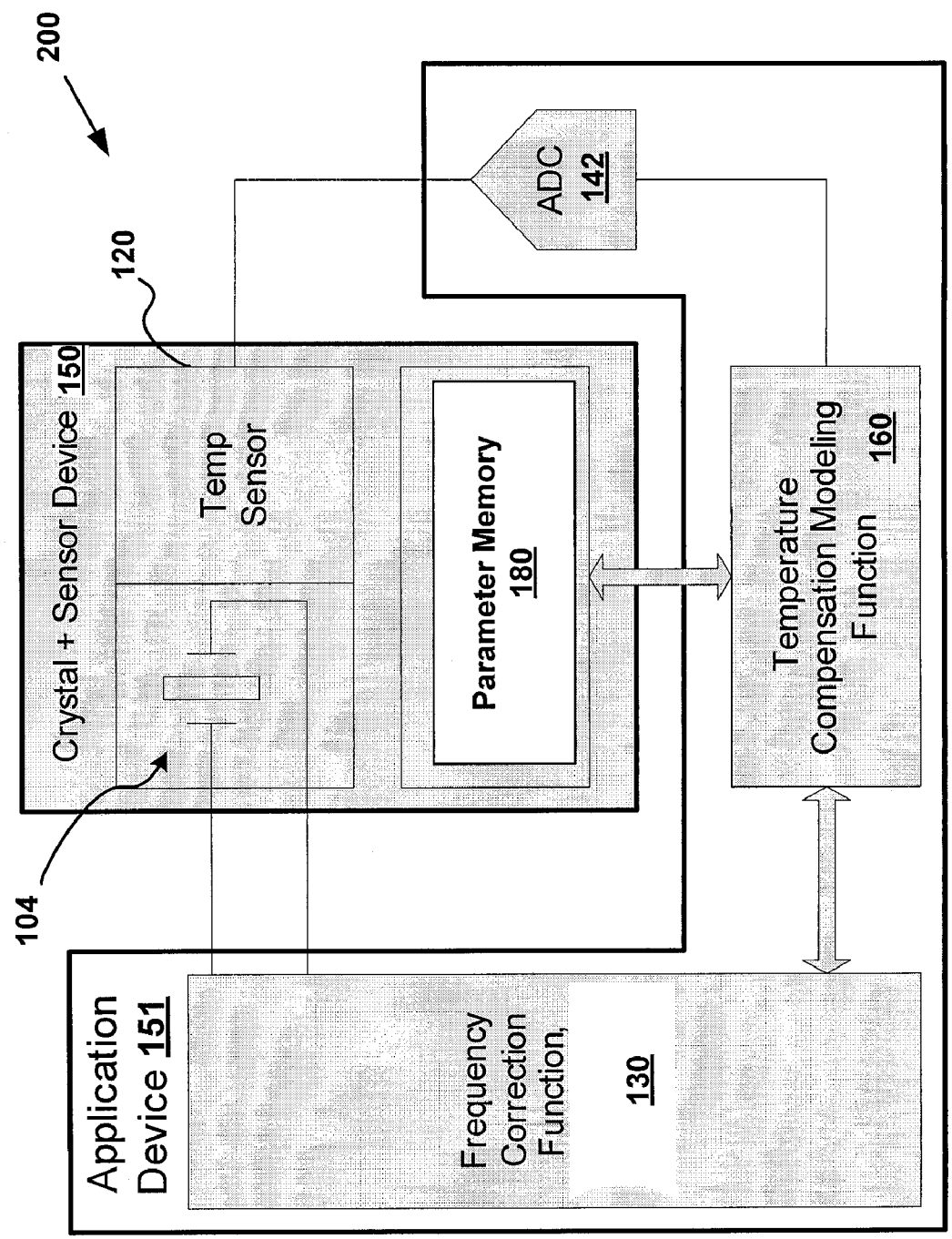
FIG. 2 is a block diagram of another example of a device that performs functions that use a signal having a frequency generated by a temperature compensated crystal oscillator circuit.

FIG. 2 is a block diagram of another use model 200, which illustrates the use of a crystal oscillator circuit 150 that includes a parameter memory 180 in a package along with the crystal oscillator 112 and the temperature sensor 120. During operation, the temperature compensation modeling function 180 retrieves parameters from the parameter memory 180 in the crystal oscillator circuit 150 package.

Figure 3:
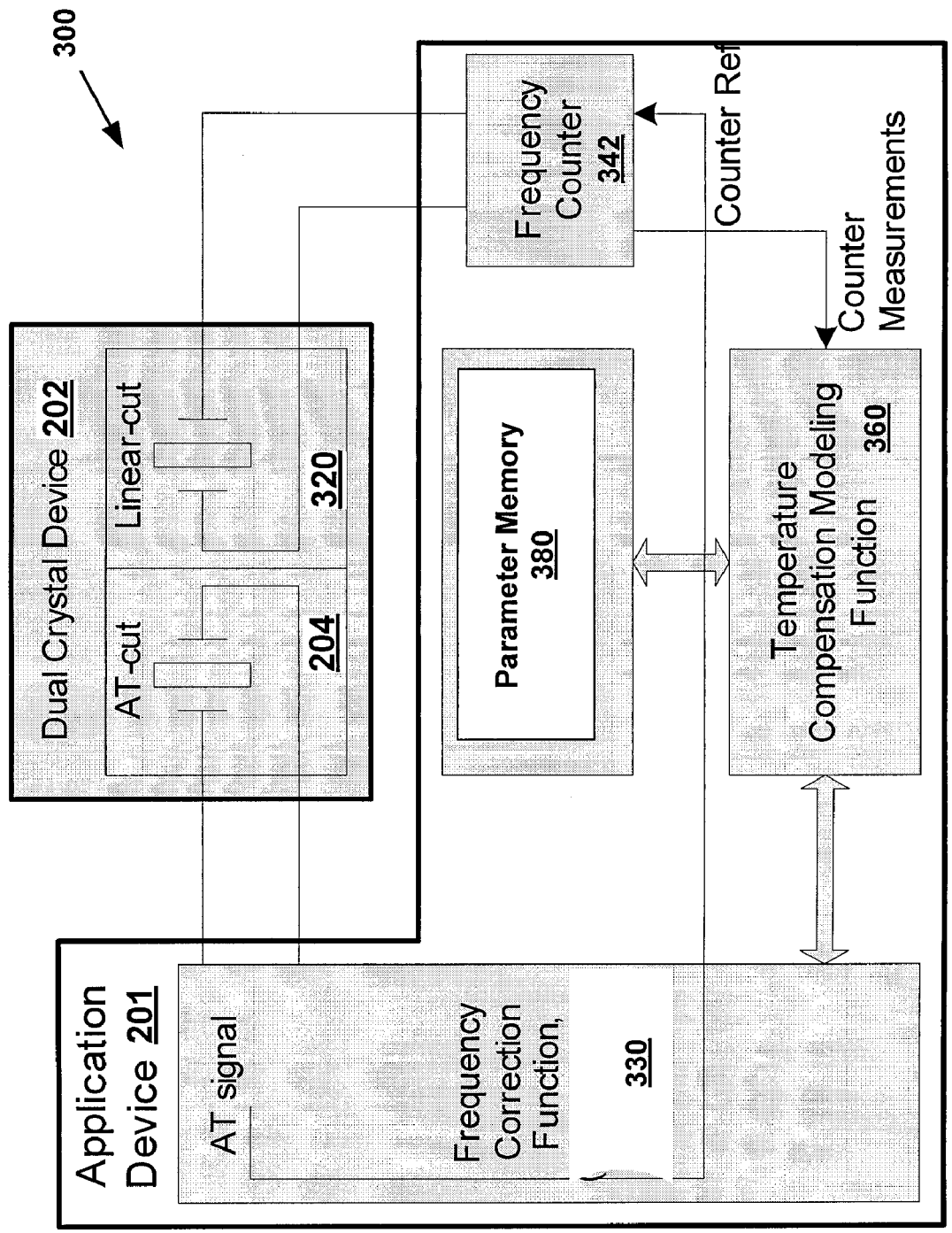
FIG. 3 is a block diagram of another example of a device that performs functions that use a signal having a frequency generated by a temperature compensated crystal oscillator circuit.
Figure 4:
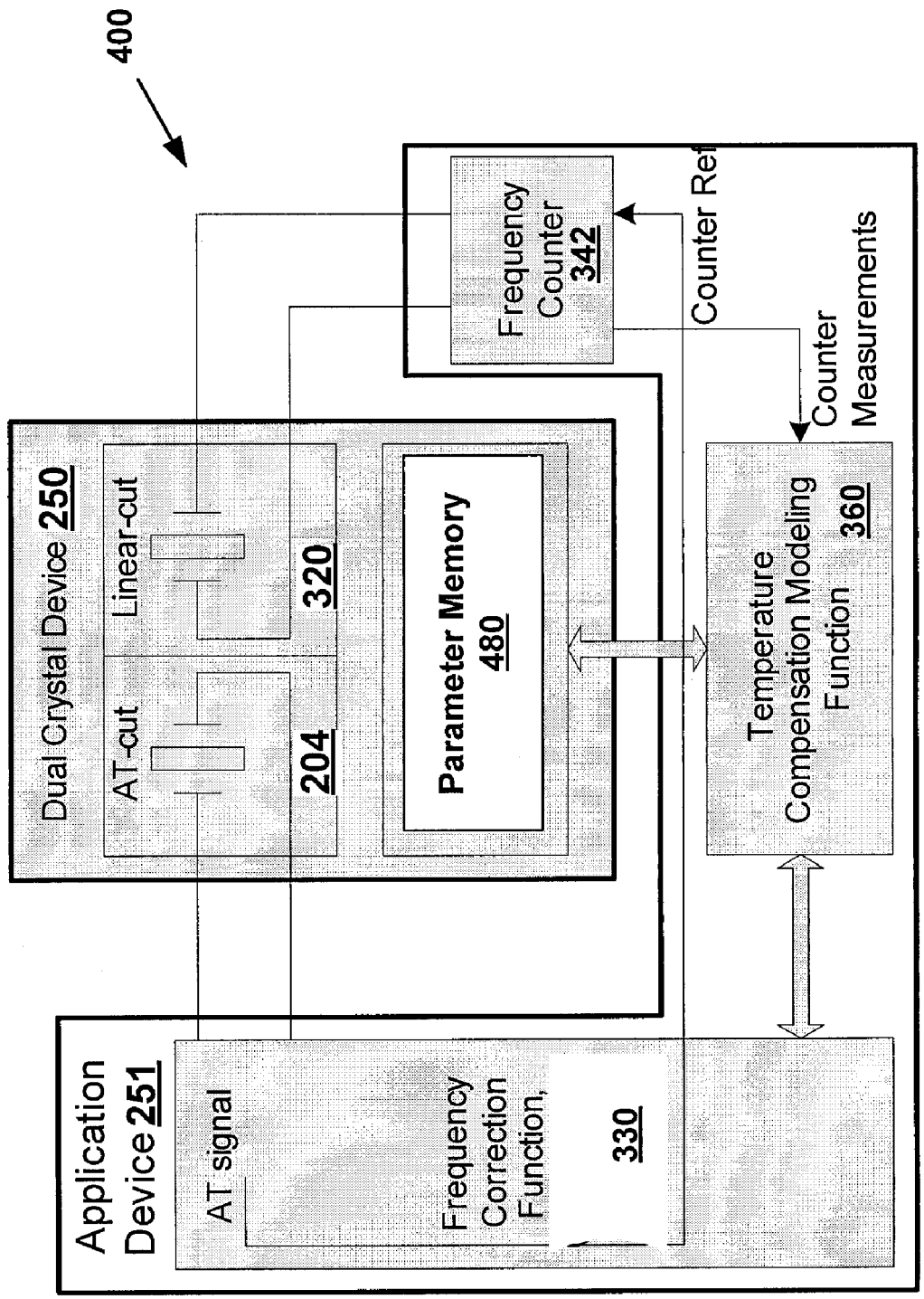
FIG. 4 is a block diagram of another example of a device that performs functions that use a signal having a frequency generated by a temperature compensated crystal oscillator circuit.

In the use models 100 and 200 in FIGS. 1 and 2, respectively, the temperature sensor 120 is included within the crystal package and the ADC 142 in the application device 142 digitizes the output of the temperature sensor 120. In alternative examples of the use models 100 and 200 in FIGS. 1 and 2, the ADC 142 may be included in the crystal package with the temperature sensor 120. This would advantageously permit the temperature compensation model to account for the temperature variations to the ADC 142 as well as to the crystal package during calibration procedures. FIGS. 3 and 4 illustrate operation of use models that implement an alternative example of a crystal oscillator circuit.

FIG. 3 is a block diagram of a third example of a use model 300 in which a dual crystal oscillator device 202 provides a frequency signal to an application device 201. The dual crystal oscillator device 202 includes a first crystal 204, which may be an AT-cut crystal, and a second crystal 320 having linear temperature versus frequency characteristics. The application device 201 includes a frequency counter 342, a temperature compensation modeling function 360, a parameter memory 380, and a frequency correction function 330.

The second crystal 320 in the crystal oscillator circuit 202 is closely located to the first crystal oscillator 204. The second crystal 320 may be an X or Y cut crystal that generates a frequency linearly proportional to temperature.

During operation of the use model 300 in FIG. 3, the first crystal 104 outputs a crystal frequency signal to the frequency correction function 330. The second crystal 320 outputs a sensing frequency signal to the frequency counter 342. The crystal frequency signal is output from the frequency correction function 330 to the frequency counter 342 to function as a counter reference frequency. As the temperature in the dual crystal oscillator device 202 changes, the sensing frequency signal changes linearly with the temperature. The change in frequency of the sensing frequency signal is sensed by the frequency counter 342 and the counter measurements indicative of changes in temperature are input to the temperature compensation modeling function 360.

The temperature compensation modeling function 360 functions in a manner similar to the temperature compensation modeling function 160 described above with reference to FIGS. 1 and 2. The temperature compensation modeling function 360 receives parameters for the temperature compensation model from the parameter memory 380 and the temperature measurement from the frequency counter 342. The temperature compensation modeling function 360 may implement or access a separate function to translate the counter measurements received from the frequency counter 342 to a temperature change or level.

The frequency correction function 330 functions similar to the frequency correction function 130 described with reference to FIGS. 1 and 2. The frequency correction function 330 in FIG. 3 however couples the crystal frequency signal output by the first crystal oscillator 204 to the frequency counter 342 for use as a reference frequency. In another example, the crystal frequency signal may be coupled to the frequency counter 342 directly from the dual crystal oscillator circuit 202.

FIG. 4 is a block diagram of a fourth example of a use model 400 in which a dual crystal oscillator device 250 provides a frequency signal to an application device 251. The dual crystal oscillator device 250 includes a first crystal oscillator 204, which may be an AT-cut crystal, a second crystal oscillator 320 having linear temperature versus frequency characteristics, and a parameter memory 480. The application device 251 includes a frequency counter 342, a temperature compensation modeling function 360, and a frequency correction function 330. The second crystal 320 in the crystal oscillator circuit 250 is closely located to the first crystal oscillator 204. The second crystal 320 may be an X or Y cut crystal that generates a frequency linearly proportional to temperature.

The functions in the application device 251 operate in a manner similar to those of the application device 201 in FIG. 3. The parameter memory 480 in the use model 400 of FIG. 4 is physically located on the dual crystal oscillator circuit 250 and not on the application device 251.

As described above, FIGS. 1-4 depict examples of use models for crystal oscillator circuits having crystal oscillators closely-located with a temperature sensing device. The use models 100, 200 in FIGS. 1 and 2 use crystal oscillator circuits having a temperature sensor that outputs a voltage that is a function of the temperature (e.g. proportional to the temperature). The use models 300, 400 in FIGS. 3 and 4 use dual crystal oscillator circuits in which the crystal to be compensated is closely located with a second crystal having a frequency that is a function of the temperature. Another example of a crystal oscillator circuit includes a crystal oscillator capable of a dual-mode vibration, which may be sensed using a frequency counter-based circuit to measure the first mode with respect to the second (temperature sensitive) mode.

The use models 100, 200, 300, 400 described above implement a similar temperature compensation modeling function that retrieves parameters stored in a parameter memory and applies the parameters to the modeling function to generate a frequency correction. The coefficients in the parameter memory in the examples described in FIGS. 1-4 are advantageously stored in a non-volatile memory during a calibration procedure during manufacturing. In the use models 100, 300 described above with reference to FIGS. 1 and 3, the parameter memory is located in the application device 101, 201. In the use models 200, 400 described with reference to FIGS. 2 and 4, the parameter memory is located in the crystal oscillator circuit package. The calibration procedure performed during manufacturing determines temperature parameters for an individual crystal oscillator component. The calibration procedure may take different forms and operate in different environments. The description below with reference to FIGS. 5-8 describes systems and methods for implementing a calibration procedure; however, it is understood that other ways may be used and remain consistent with the present invention. The systems and methods for implementing a calibration procedure described below assume a temperature compensation model that includes coefficients of terms related to temperature readings where the model yields information about a temperature-related frequency error that characterize a thermal dynamic response of the component. In the examples below, the parameters are the coefficients, but the coefficient memory may also include additional data related to the model.

Figure 5:
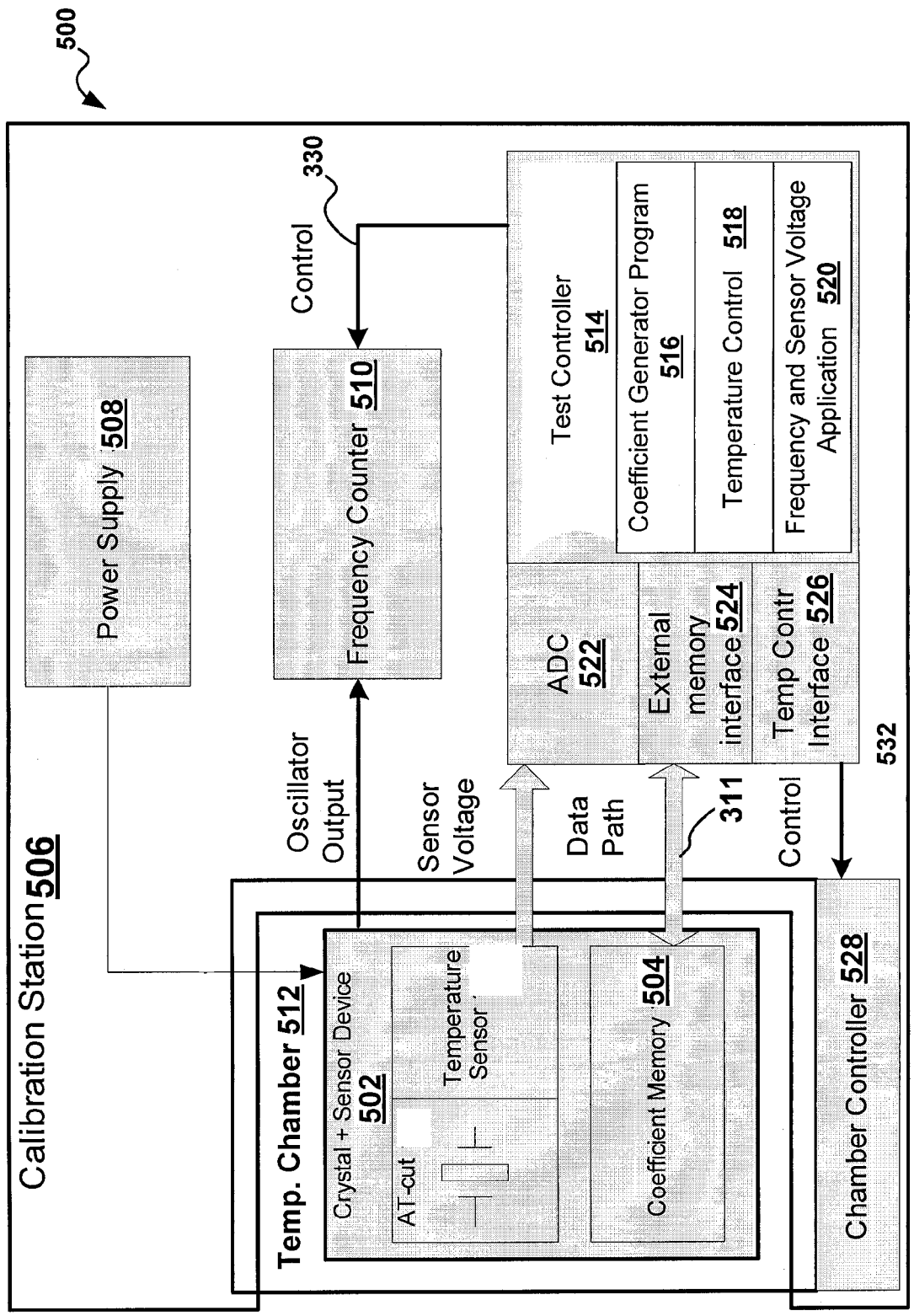
FIG. 5 is a block diagram of an example of a system for temperature compensating a crystal oscillator circuit.

FIG. 5 is a block diagram illustrating a system for calibrating a crystal oscillator component 502, with internal coefficient memory 504, in a calibration manufacturing system 500. The calibration manufacturing system 500 may be used to calibrate hundreds or thousands of devices simultaneously in ways that are known in the industry with the use of systems of multiplexers and switches. The calibration manufacturing system 500 includes a calibration station 506 that includes a power supply 508, a frequency counter 510, a temperature chamber 512, and a test controller computer 514. The test controller computer 514 in FIG. 5 includes software such as a coefficient generator program 516, a temperature chamber control program 518, and a frequency and sensor voltage acquisition program 520.

The crystal oscillator component 502 is placed in the temperature chamber 512 during the calibration procedure. The temperature chamber 512 is controlled by a chamber controller 528, which may receive control signals from the test controller computer 514 via a temperature controller interface 526. During the calibration procedure, the test controller computer 514 controls the temperature chamber 512 to provide a desired calibration temperature profile. The calibration procedure may proceed as follows:

1. Control the temperature in the environment of the device under test (i.e. the crystal oscillator component 502, to follow a desired profile of temperature versus time. The test controller computer 514 commands a temperature controller interface 526 to transmit control signals to a chamber controller 528. The chamber controller 528 may include hardware and/or software that controls environmental parameters (e.g. temperature) inside the temperature chamber 512.

2. Control, accept and store frequency measurements from a frequency measurement device such as a frequency counter 510 as the temperature is being varied according to the test profile. The test controller computer 514 commands the frequency counter 310 over a suitable control interface 330. This may be a shared interface with a chamber control interface 532. An example of a standard interface that may be used is the IEEE 488 or similar. The measurements from the frequency counter 510 are typically returned to the test controller computer 514 over the control interface 330. This is done as often as needed to ensure convergence of the coefficient generator program.

3. Control, accept and store measurements from the temperature sensor on the crystal oscillator component 502 through an ADC 522 as the temperature is being varied. The test controller computer 514 periodically commands the ADC 522 to measure the sensor voltage. This is done as often as needed to ensure convergence of the coefficient generator program.

4. Using the stored measured data, calculate coefficients for each device 502.

5. Write the calculated coefficients through an external memory interface 524 over a data path 311 into the non-volatile memory 504 (winch may be non-volatile memory) in the device under test 502.

In the example in FIG. 5, the coefficient generator program 516 includes functions that generate the temperature coefficients for the crystal oscillator component 502. The coefficient generator program 516 in FIG. 5 implements a temperature compensation model as described below, which produces a set of coefficients which will model the expected behavior of the oscillator during operation in the application device (i.e. at 101 in FIG. 1). In controlling the temperature during the calibration procedure, the test controller 514 runs a temperature test profile described below in more detail with reference to FIGS. 9 and 10.

Figure 6:
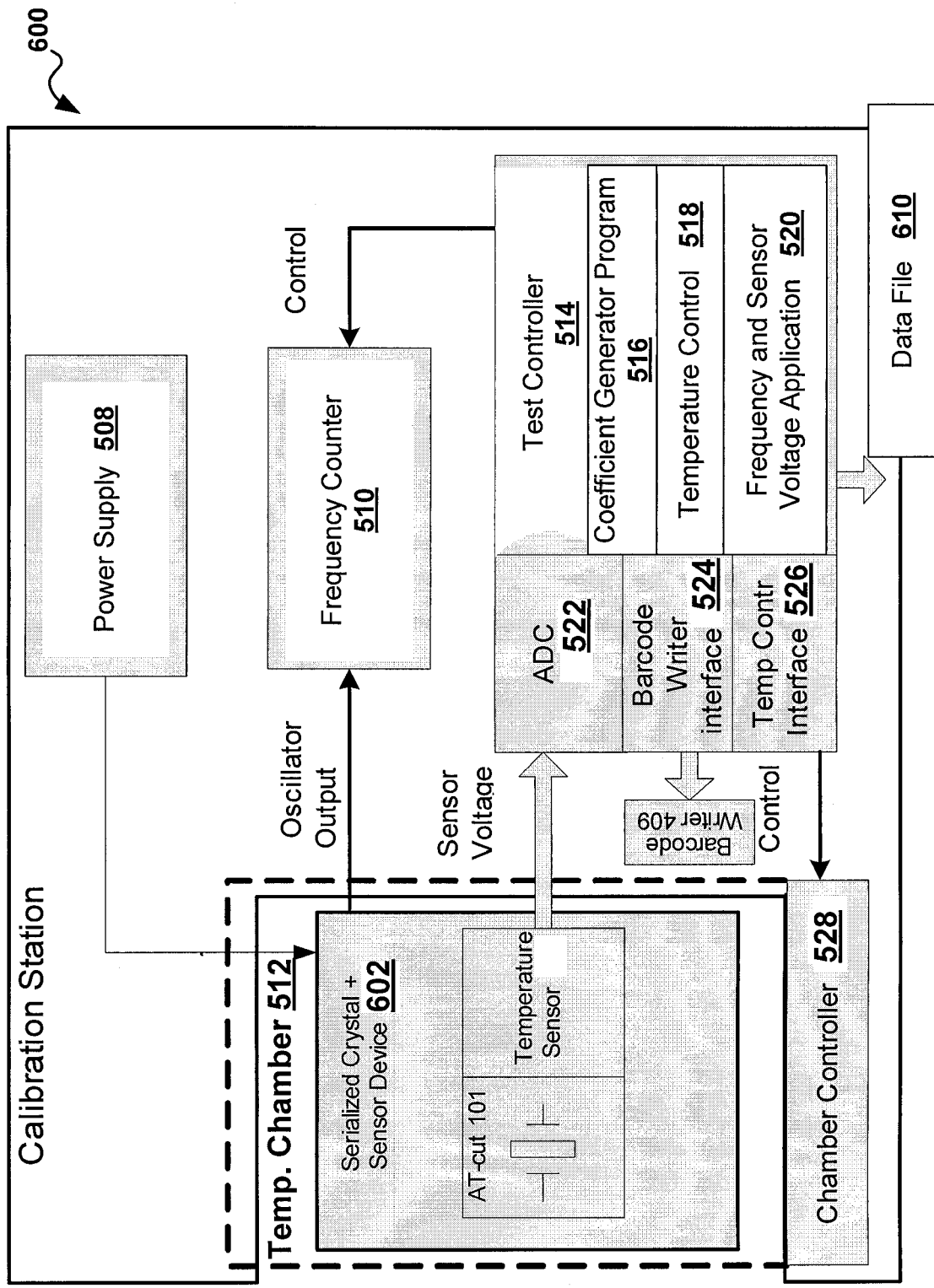
FIG. 6 is a block diagram of another example of a system for temperature compensating a crystal oscillator circuit.

FIG. 6 shows another example of a system 600 for performing a calibration procedure. In the system 600, the calibration procedure is used to generate coefficients for a crystal oscillator device 602 that does not include a non-volatile memory inside the device. The coefficients are generated during manufacture of the crystal oscillator component 602 in a manner similar to the system 500 described above with reference to FIG. 5. However, in the system 600 in FIG. 6, the coefficients are generated and output to an electronic file 610 and sent to a purchaser of the crystal oscillator component 602. The purchaser may then store the electronic file 610 containing the coefficients in another device in the same product in which the crystal oscillator component 602 is used. This makes use of other potentially available memory external to the crystal oscillator component 602, thereby reducing the cost of the crystal oscillator component 602.

Figure 7:
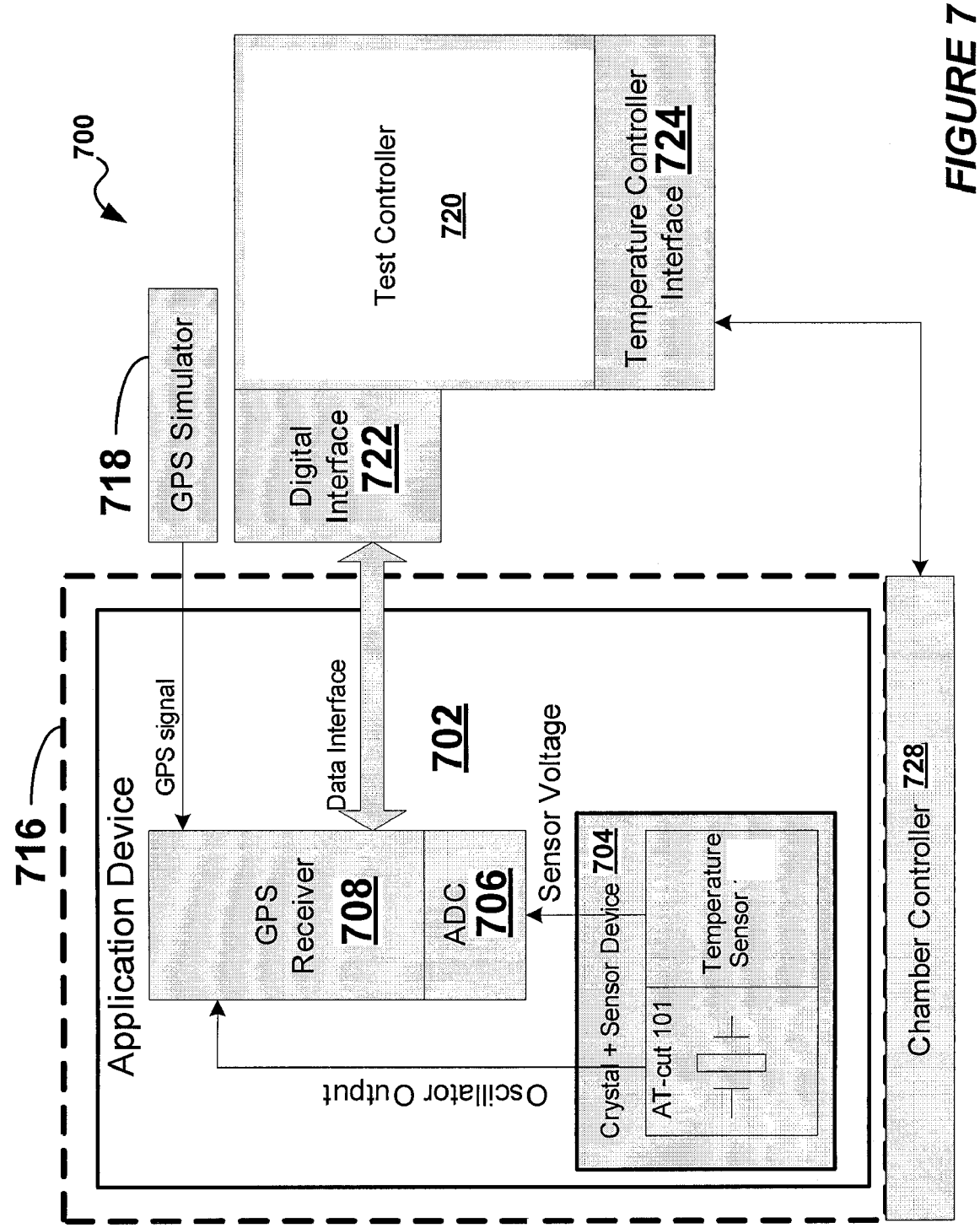
FIG. 7 is a block diagram of another example of a system for temperature compensating a crystal oscillator circuit.

In order to achieve a process such as the example described in FIG. 6 in mass production, the crystal oscillator component 602 may be serialized so that the correct coefficient data set is stored in the product with the correct crystal oscillator component 602. For example, the crystal oscillator components 602 may be serialized with barcodes that may be applied to the packaging of the crystal oscillator components 602. Then, when the crystal oscillator component 602 is to be installed in a product in which it will operate, a procedure in the assembly of the product may be implemented to store the coefficients associated with the component's serial number in the memory of the product. Other ways of making the component-coefficient association accessible to the person assembling the product in which the crystal oscillator component 602 will operate include (without limitation) placement on a web-site accessible by the person with capabilities of searching by serial number, and storing the coefficients in a non-volatile memory in the product with the crystal oscillator component 602. FIG. 7 is a block diagram illustrating operation of a calibration system 700 in which an application device 702 (such as the application devices 101, 151, 201, 251 in FIGS. 1-4) includes a crystal oscillator component 704, an ADC 706, and a GPS Receiver 708. In the system 700 of FIG. 7, it is possible to calibrate the crystal oscillator component 704 after installation into the application device 702. The application device 702 may be placed into a temperature chamber 716 to perform a calibration procedure of the substantially assembled application device 702.

During the calibration procedure, the application device 702 may be placed into a calibration mode by a calibration controller 720. The calibration controller 720 may be a computer similar to the test controller computer 514 in FIGS. 5 and 6. Once the application device 702 is in a calibration mode, a strong GPS signal may be generated by a GPS simulator 718 and transmitted for reception by the GPS receiver 708. This strong GPS signal can be acquired by the GPS receiver 708 regardless of any reasonable amount of oscillator frequency error. After the GPS receiver 708 has acquired the signal it can output readings of the frequency error of the oscillator output referenced to the GPS signal, which is of sufficiently high accuracy.

The calibration controller 720 may then control the temperature chamber 716 to execute a temperature test profile, collect readings from the ADC 706 and the frequency error from the GPS Receiver 708, and capture the collected data into memory (not shown) in the calibration controller 720. When the temperature profile is complete, then a coefficient generator program in the calibration controller 720 may calculate the coefficients. The coefficients may then be written back into a non-volatile memory in the application device 716 for use during normal operation.

One advantage of the system 700 in FIG. 7 is that temperature compensation is performed on a complete system. Other parts besides the crystal oscillator component 704 may be subject to temperature effects. For example, the ADC 706 also generates outputs that may vary with temperature. In the system 700 in FIG. 7, the calibration is performed on the system as a whole such that the coefficients generated also account for effects of the ADC 706.

Figure 8:
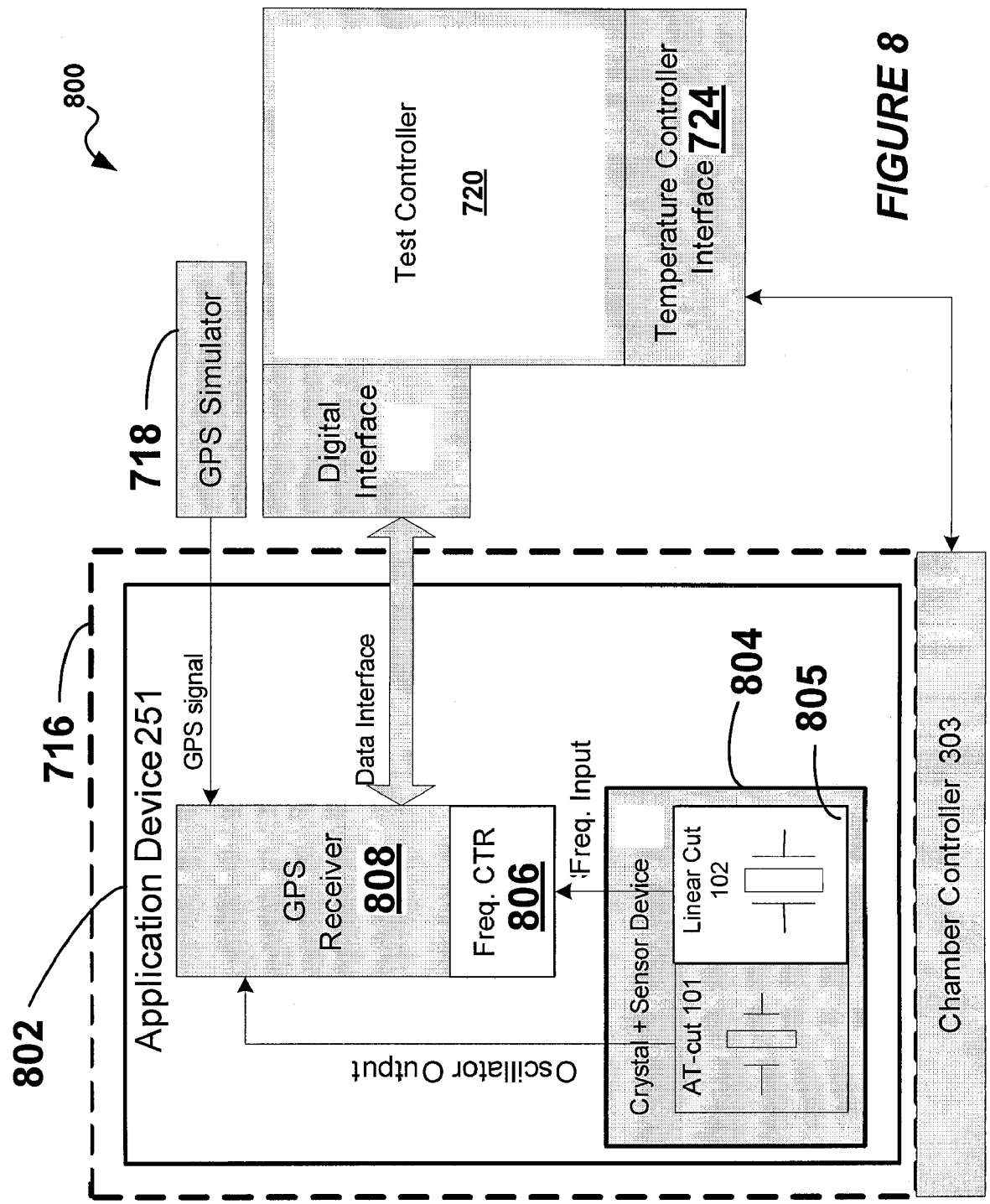
FIG. 8 is a block diagram of another example of a system for temperature compensating a crystal oscillator circuit.

FIG. 8 is a block diagram illustrating operation of a calibration system 800 similar to the system 700 shown in FIG. 7, except that the system 800 in FIG. 8 performs a calibration procedure for an application device 802 that includes a dual crystal oscillator circuit 804. The application device 802 in FIG. 8 includes a GPS receiver 808 that uses a frequency counter 806 to sense temperature changes as indicated by a sensing crystal 805 in the dual crystal oscillator circuit 804.

The system in FIG. 8 may perform a calibration procedure using the calibration controller 720 and GPS simulator 718 with the application device 802 in the temperature chamber 716 as described above with reference to FIG. 7. Those of ordinary skill in the art will appreciate that the calibration procedures described above in FIG. 5-8 are examples and not intended to be limiting.

2. Quartz Crystal Dynamic Response Model

The systems described above with reference to FIGS. 5-8 advantageously implement calibration procedures to enable temperature compensation in crystal oscillator components by determining the coefficients for a model which accurately characterize the individual component. The temperature compensation model advantageously parametrically models various temperature characteristics in crystals that include the quartz, or other material such as silicon thermal dynamic response.

An example of a temperature compensation model that may be used is as follows (in Matlab™ format):

Frequency error=(Coefficients 'a'.*$9^{th}$ order polynomial of temp) +(Coefficients '$b1$'.*5 th order polynomial of temp)* (Coefficients '$b2$'.*2nd order polynomial of filtered Temp ramp rate)+ (Coefficients 'c'.*$1^{st}$ order Polynomial of filtered temperature)

Expressed in conventional mathematical form, the model is as follows:

Frequency error=$(a_0+a_1T+a_2T^2+a_3T^3+a_4T^4+a_5T^5+a_6T^6+a_7T^7+a_8T^8+a_9T^9)+\{(b_{1,0}+b_{1,1}T+b_{1,2}T^2+b_{1,3}T^3+b_{1,4}T^4+b_{1,5}T^5)*(b_{2,0}+b_{2,1}R+b_{2,2}R^2)\}+(c_0+c_1T_f)$ or, Frequency=$(a_0+a_1T+a_2T^2+a_3T^3+a_4T^4+a_5T^5+a_6T^6+a_7T^7+a_8T^8+a_9T^9)+\{(b_{1,0}+b_{1,1}T+b_{1,2}T^2+b_{1,3}T^3+b_{1,4}T^4+b_{1,5}T^5)*(b_{2,0}+b_{2,1}R+b_{2,2}R^2)\}+(c_0+c_1T_f)+f_{nom}$; where $f_{nom}$ is the nominal frequency of the device.

The equation for Frequency error above comprises three parts. The first part is a polynomial with coefficients $a_n$ that computes the static part of the model. The second part above is the dynamic part and it includes a product of polynomials with coefficients $b_{1,x}$ and $b_{2,y}$, respectively. The third part is a model of material adsorption and desorption and it includes the polynomial with coefficients $c_0$ and $c_1$. The three parts in the above model relate to physical phenomena as follows:

$a_n$→Simple temperature dependence
$b_{1,x}$→Temperature dependence function of the ramp rate correction
$b_{2,y}$→Ramp rate dependence
$c_0$ and $c_1$→Adsorption and desorption The exact powers in the model above are not critical; for example, a $7^{th}$ order static part ($a_n$), or even less, may be adequate in some cases. This may also be true for the other terms; that is, the powers may be smaller or larger as needed for adequate error. The equations above include filtering to be applied to the sensor measurements for b2 and for c.

a. The "$b_2$" Filtering for Sensor Ramp Rate, R

The $b_2$ filtering for the sensor ramp rate, R, is provided to model the low pass filtered thermal response due to the heat capacity and the thermal resistance of the package and the devices inside. This internal dynamic response that is a low-pass-filtered version of the applied thermal environment is present because neither the crystal nor the sensor (on the inside of the package) "sees" the applied external variation of the temperature with no delay. In an example of a temperature compensation model, the "b" terms use a $2^{nd}$ order Butterworth lowpass-filtered version of the raw sensor measurements. The $b_2$ coefficient may actually be the filter cutoff frequency in an analog instantiation for software. Other filter functions may be applicable, but the filter function is applied to the $b_2$ terms in examples described herein. Both terms of the filter function are assumed to have the same cutoff frequency, so there is one coefficient to be determined for this low pass function. Since the "$b_2$" term is dynamic, not static, the coefficient generator program 516 applies the filtering to the measured sensor data before fitting the data to determine the "$b_2$" coefficients.

The filter cutoff frequency (i.e. "$b_2$") is a function of how the package, the sensor and the crystal are designed. In some example components, the individual devices may not have significantly different dynamic time constants, although the "b" coefficients themselves may have large variations. This means that the "b" time constant may be determined one time for all devices of a given type. If the design of the packaging is changed, then the "b" time constant might have to be determined again. The "b" time constant may be determined by gathering data on a modest number of units such as 100, and hand-adjusting the "b" time constant until the best overall errors are obtained. This value may then be entered as a fixed number into the filtering of the measured sensor data, either voltage in the crystal oscillator circuits described in FIGS. 1 and 2, or frequency in the dual crystal oscillator circuits described in FIGS. 3 and 4. The fixed number is then used both in the coefficient generator program 516 and in the application device after calibration. It is stored as just another coefficient, but this number is the same for all units of a given design.

b. The "c" Filtering for Absorbtion and Desorbtion

The "c" filtering terms are provided to model the relatively slow error term which causes the frequency error to rise in an exponential of time as the temperature rises in a step, and fall as an exponential in time as the temperature is reduced in a step. This error term is separate and different from the "$b2$" dynamic terms and has a different equivalent filter cutoff frequency. In one example of the temperature compensation model, a $2^{nd}$ order Butterworth similar to that used for the "$b_2$" filter is used. One difference is that the cutoff frequency is lower in the "c" filter than in the "b2" cutoff filter corner. The error associated with the "c" filter may have a characteristic time constant that is not varying from unit-to-unit. To account for this effect, the model described herein uses a separate coefficient for the cutoff of the equivalent filter function.

This coefficient may be determined in the same manner as the "b2" filter cutoff frequency, in a pre-manufacturing test with a modest number of units such as 100.

The example model described herein is a combined linear and nonlinear model. This allows both static compensation of the frequency versus temperature curve and corrections for the dynamic temperature response of the crystal (or oscillator based on a different material such as silicon) to quickly changing temperature conditions where the static model alone will have inadequate accuracy. Additionally the model includes nonlinear directional (hysterisis) modeling for temperature versus frequency directional dependence. This is a condition where a crystal frequency versus temperature characteristic is different when the temperature is rising than when it is falling through the same range. This is achieved through the cross-multiplication in the second term (i.e. the Ramp Rate.)

3. Example Temperature Test Profile to Determine the Dynamic Response

Figure 9:
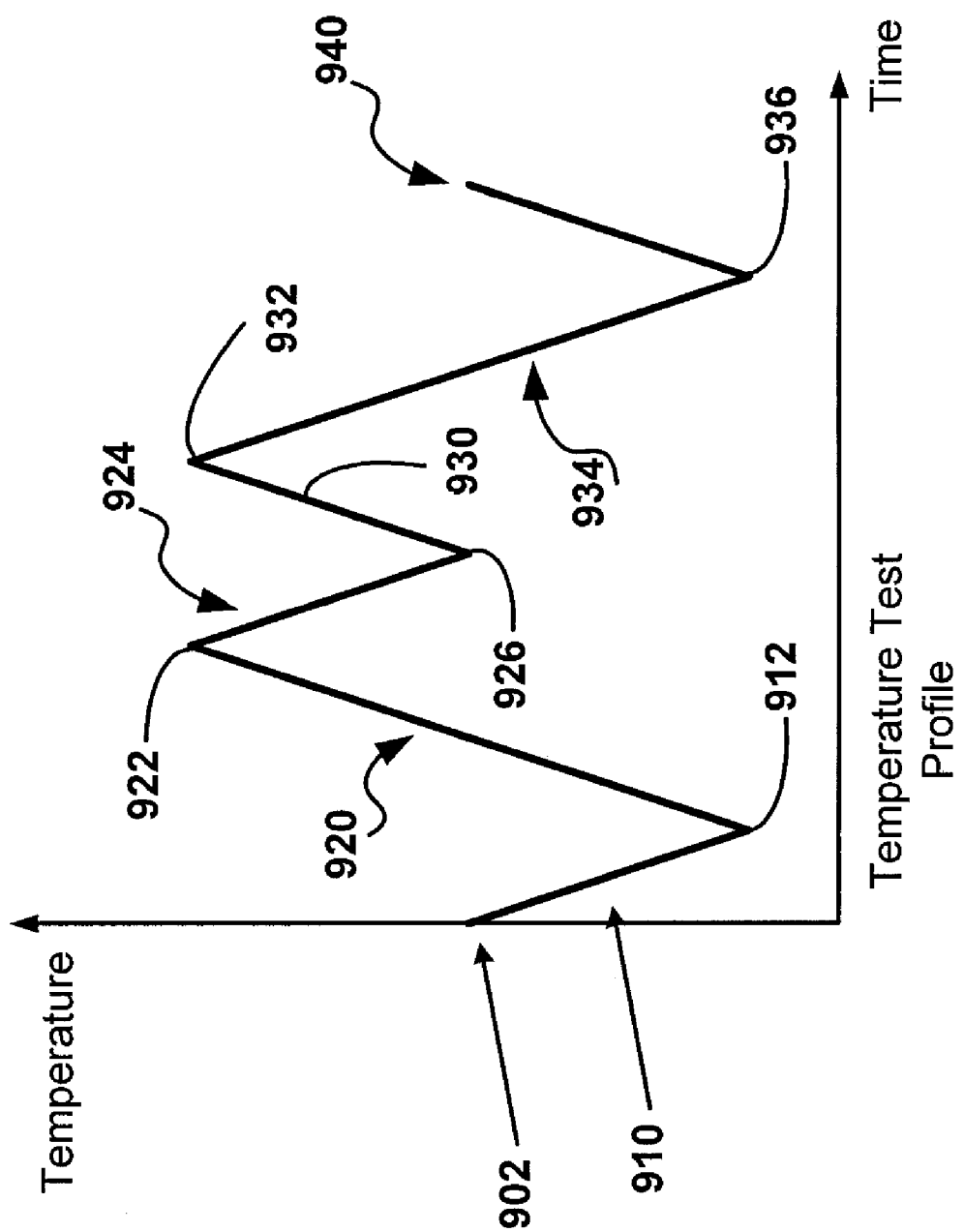
FIG. 9 is a graph of an example of a temperature test profile that may be implemented in systems and methods for temperature compensating a crystal oscillator circuit.

The temperature compensation model described above may be advantageously used in a calibration procedure that follows a temperature test profile such as the one illustrated in FIG. 9. A temperature test profile is the temperature v. time pattern followed by the temperature test chamber. The crystal oscillator component (i.e. the crystal oscillator component 102 in FIG. 1) is operated in the temperature test chamber (e.g. using a calibration procedure described in FIG. 5), and the temperature is varied according to the selected profile. In known temperature test profiles, a sweep of the temperature is made up to a desired point. A delay then waits for device stabilization before the frequency is measured. The process is then repeated until as many points as needed are collected.

In the example temperature test profile shown in FIG. 9, the temperature in a temperature test chamber may be set to an initial temperature 902. The chamber may be cooled as shown at 910 to a low point 912. The chamber may then be heated at 920 to a high point at 922. The chamber is then cooled at 924 to a final cycle temperature at 926. The cycle may then be reversed by heating the chamber at 930 to a high point 932 that is substantially the same as the high point at 922. The chamber is then cooled at 934 to a low point 936 that is substantially the same as the low point at 912. The chamber is then heated to a final temperature at 940 that is substantially the same as the initial temperature 902. The temperature test profile in FIG. 9 advantageously uses dynamic modeling. That is, there is no delay before measuring the frequency at any temperature setting, which allows for faster testing. In addition, the profile includes two cycles of measurements. The first cycle begins at 902 and ends at 926. The cycle is then reversed from 926 to 940. By sweeping the temperature through a first cycle in the test profile and then going through the same cycle backwards, as in a time-reversal of the original cycle, this model dynamic misinterpretation problem may be eliminated.

4. Method of Calibration on the Final Product Test Production Line

The temperature compensation model described above advantageously allows for characterizing individual crystal oscillator components and correcting the individual components for temperature dependence. The temperature compensation model may be implemented in a variety of ways in a procedure for calibrating crystal oscillator components. The compensation may be applied through software in a DSP processing hardware or software-based signal receiver, or it may be applied through hardware which actually produces an electrical signal which has the frequency corrected.

Examples of methods for calibrating a crystal oscillator component described below assume implementation of the crystal oscillator component in a GPS receiver. Those of ordinary skill in the art will appreciate that use and advantages of examples of the systems and methods described herein may be implemented for use of the crystal oscillator component in any product.

Figure 10:
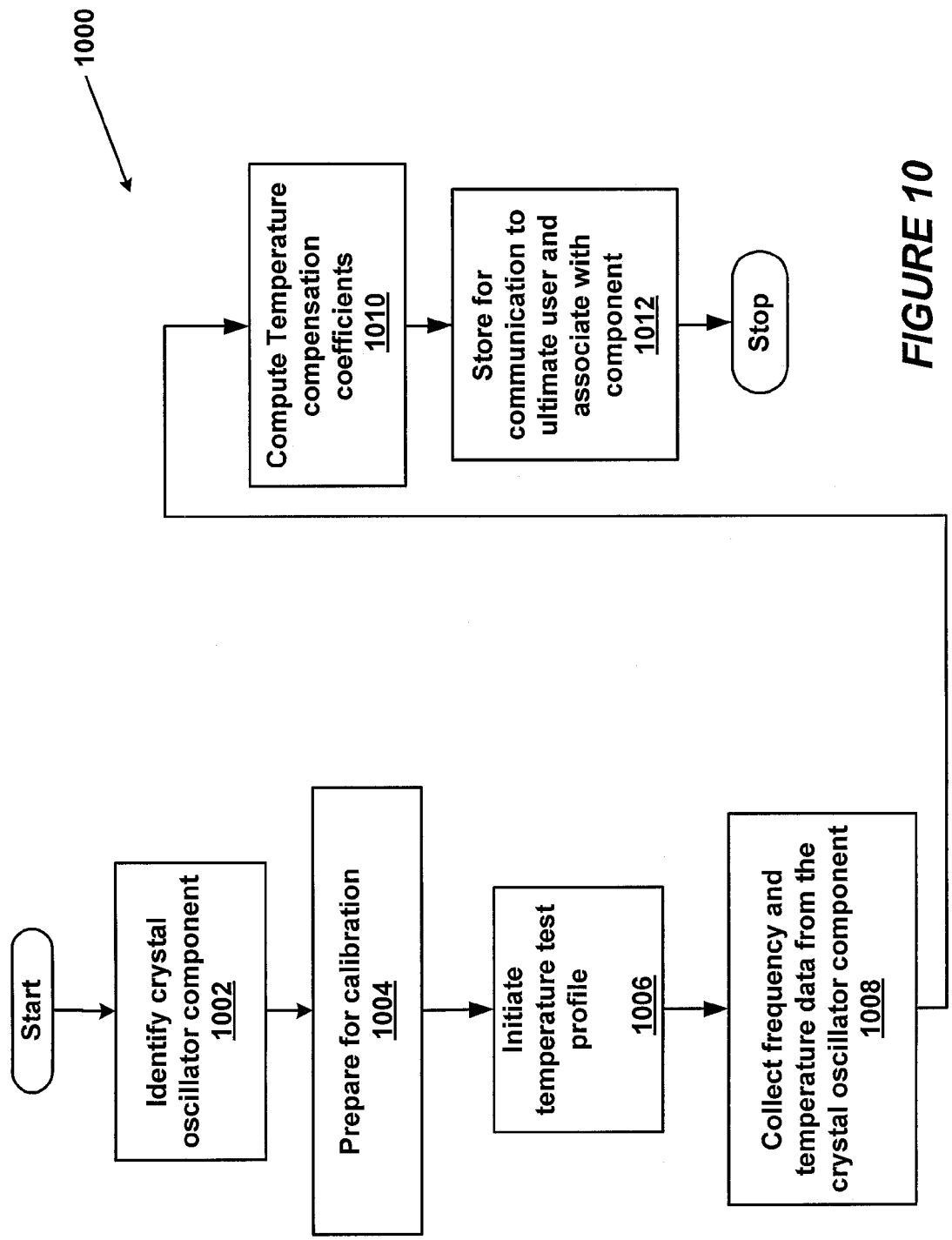
FIG. 10 is a flowchart of an example of a method for temperature compensating a crystal oscillator circuit.

FIG. 10 is a flowchart of an example of a method 1000 for calibrating a crystal oscillator component where the component is calibrated during its manufacture. The method may be started when manufacture of the crystal oscillator component is substantially complete. At step 1002 of the method 1000, the crystal oscillator component may be identified by, for example, a serial number, or other ways of identifying the individual crystal oscillator component. Alternatively, the crystal oscillator may have a non-volatile memory included in the device, in which case serialization is not necessary. In another example, the oscillator device may have a relatively small non-volatile memory that is large enough for a serial number but not large enough for all the coefficients. In this case the serial number may be read out in the production process for the application device, and then the coefficient data may be retrieved from a web site or other on-line access, and the data for that serial number may then be stored in a larger non-volatile memory in the application device.

Referring back to FIG. 10, at step 1004, the component is prepared for calibration. This preparation may entail mounting the individual component on a testbed. The individual component is mounted such that it is in a temperature test chamber to permit subjecting the component to a varying temperature while operating the component to generate a frequency. At step 1006, a temperature test profile similar to the temperature test profile in FIG. 9 is initiated to expose the crystal oscillator component to temperature that varies with time. At step 1008, the temperature and frequency data generated by the crystal oscillator component is collected and stored in a timed sequence. At step 1010, the temperature compensation coefficients are computed. The coefficients may be determined based on frequency and temperature data collected during the temperature test profile by performing the following in two iterations. In the first iteration, the coefficients are initialized to zero. On the second iteration, the coefficients are initialized to the values generated in the first iteration. In the description below, the references to functions are for Matlab. In addition, the temperature data is received as voltage levels.

In each iteration, the following procedure is performed:
1. Curve fit for non-dynamic model: Perform a $9^{th}$ order polyfit of voltage to the mean of all data binned by voltage. Then, use the resultant coefficients as input to Matlab "polyfit" the error by ramp rate coefficients. This prevents extremely large numbers of points taken when the temperature may have been steady from dominating the fit error.
2. Curve fit for adsorption/desorption: Using the filtered voltage as a model parameter, estimate the adsorption/desorption by minimizing the predicted error.
3. Temperature ramp rate (dynamic) fitting: Use Matlab "fminsearch" to find a mixed polynomial in voltage and ramp rate to match the frequency error so far.

Referring back to FIG. 10, when the coefficients for a crystal oscillator component are determined, they are then stored for use with that individual component at step 1012. The storage and use of the coefficients may be implemented in a variety of ways. As described above, the coefficients may be associated with or integrated with a serial number for the part and then made available to the user in a variety of ways, such as barcode, flash drive, etc. The coefficients may be printed out for manual entry by the user, or made available on a web-site for download retrieval by the user.

Figure 11:
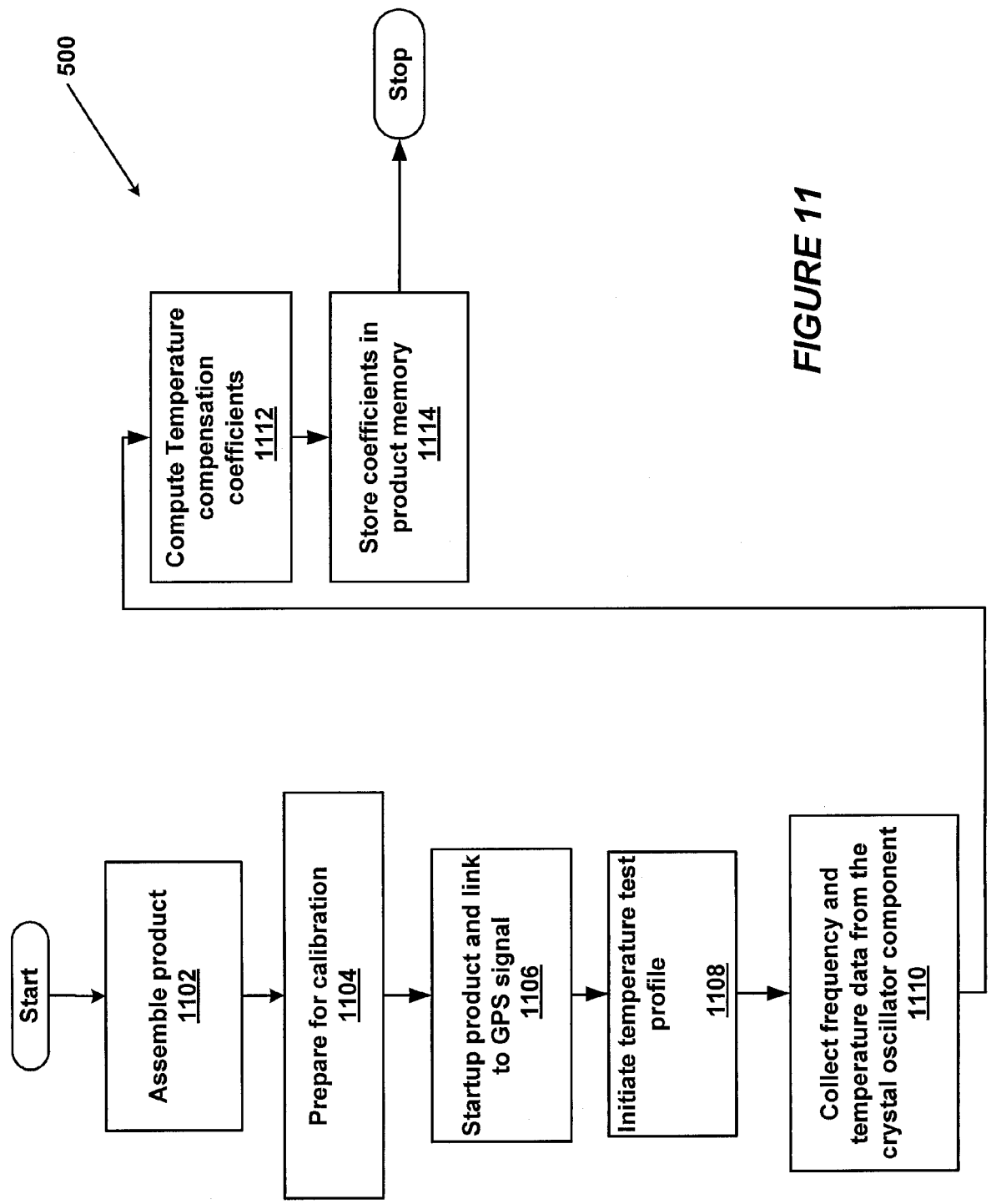
FIG. 11 is a flowchart of another example of a method for temperature compensating a crystal oscillator circuit.

FIG. 11 is a flowchart of another example for calibrating a crystal oscillator component to operate with frequency correction for temperature effects. In the example in FIG. 11, the crystal oscillator component is installed in a product in which it is intended to operate (for example, a GPS receiver) as indicated at step 1102. At step 1104, the product is prepared for calibration. Step 1104 may involve connecting the GPS receiver to a testbed in a temperature test chamber in which the GPS product is operated while subjected to a temperature test profile. At step 1106, the product is powered up and a GPS signal is acquired. At step 1108, the temperature test profile is initiated using a temperature test profile similar to the one described above with reference to FIG. 9. At step 1110, frequency and temperature data is collected from the crystal oscillator component on the GPS receiver until the temperature test profile is complete. At step 1112, the temperature and frequency data collected in step 1110 may be used to compute the temperature compensation coefficients. An procedure may be included in the GPS receiver to perform step 1112. Alternatively, step 1112 may be performed in conjunction with a calibration station. Step 1112 may be performed in a manner similar to step 1010 described above with reference to FIG. 10. At step 1114, the coefficients are stored in memory on the GPS receiver for use during normal operation of the GPS receiver.

One of ordinary skill in the art will appreciate that the methods and systems described herein may be implemented using one or more processors having memory resources available for storing program code and data. One skilled in the art will also appreciate that all or part of systems and methods consistent with the present invention may be stored on or read from other machine-readable media, for example, secondary storage devices such as hard disks, floppy disks, and CD-ROMs; a signal received from a network; or other forms of ROM or RAM either currently known or later developed.

The foregoing description of implementations has been presented for purposes of illustration and description. It is not exhaustive and does not limit the claimed inventions to the precise form disclosed. Modifications and variations are possible in light of the above description or may be acquired from practicing the invention. For example, the described implementation includes software but the invention may be implemented as a combination of hardware and software or in hardware alone. Note also that the implementation may vary between systems. The claims and their equivalents define the scope of the invention.

What is claimed:

1. A method for configuring an oscillator component where the oscillator component includes a temperature sensor, the method comprising:
    exposing the oscillator component to a controlled temperature environment;
    operating the oscillator component so that the oscillator component outputs a frequency signal;
    initiating a temperature test profile by setting the temperature at the oscillator component to a first initial temperature and varying the temperature according to the profile;
    periodically measuring frequency and temperature as the temperature setting changes during the temperature test profile;
    applying the measured frequency and temperature data to a temperature compensation model to generate a plurality of parameters that characterize the oscillator component, the parameters including dynamic response parameters that characterize a thermal dynamic response of the oscillator component; and
    associating the generated plurality of parameters to the oscillator component.

2. The method of claim 1 where the step of applying the measured frequency and temperature data includes the step of:
    generating the plurality of parameters as a set of coefficients according to:

$$\text{frequency} = (a_0 + a_1 T + a_2 T^2 + a_3 T^3 + a_4 T^4 + \ldots + a_n T^n) + \{(b_{1,0} + b_{1,1} T + b_{1,2} T^2 + b_{1,3} T^3 + b_{1,4} T^4 + \ldots + b_{1,x} T^x)^* (b_{2,0} + b_{2,1} R + \ldots + b_{2,y} R^y)\} + (c_0 + c_1 T_f + \ldots c_m T_f^m)$$

where, T=temperature, R=filtered temperature ramp rate, $T_f$=filtered temperature, and $a_n$, $b_{1,x}$, $b_{2,y}$, and cm are coefficients calculated by curve fitting the acquired frequency and temperature data.

3. The method of claim 1 further comprising:
    assembling a product containing the oscillator component before the step of exposing the oscillator component to the controlled temperature environment; wherein the step of associating the calculated coefficients includes the step of storing the coefficients in memory in the product.

4. The method of claim 1 wherein the step of associating the generated parameters to the oscillator component includes:
    determining a serial number for the oscillator component; and
    storing the parameters with the serial number of the oscillator component.

5. The method of claim 1 wherein the step of associating the generated parameters to the oscillator component includes:
    determining a serial number for the oscillator component; and
    storing the parameters in a database accessible via a data network using the serial number as a link to the parameters.

6. The method of claim 5 further comprising the step of:
    storing the serial number in a local coefficient memory located on the oscillator component.

7. The method of claim 4 further comprising the step of:
    generating a barcoded label having a barcode encoded with the serial number of the oscillator component and the generated parameters.

8. The method of claim 1 further comprising the step of:
    providing the oscillator component by selecting an oscillator component from a group consisting of a crystal oscillator component and a silicon microelectric mechanical system ("MEMS") component.

9. A method for subjecting a oscillator component to a temperature test profile comprising:
    performing a first stage of the temperature test profile by:
        setting the temperature to an initial temperature;
        continuously changing the temperature over a first period of time until a first temperature setting is reached;
        continuously changing the temperature in a reverse direction over a second period of time until a second temperature setting is reached;
        continuously changing the temperature in a reverse direction relative to the direction in the second period of time over a third period of time until a third temperature setting is reached;
    performing a second stage of the temperature test profile by:
        starting with the third temperature setting and changing the temperature in a direction opposite the direction of the temperature change during the third period of time until the second temperature setting is reached;
        then changing the temperature in a direction opposite the direction of the temperature change during the second period of time; and
        then changing the temperature in a direction opposite the direction of the temperature change during the first period of time until the initial temperature setting is reached.

10. A oscillator component for generating a signal having a frequency, the oscillator component comprising:
    a component package that includes a oscillator circuit and a temperature sensing device located in substantially close proximity to the oscillator circuit, where the frequency generated by the oscillator component varies as a function of temperature characterized by a temperature compensation model associated with a plurality of parameters that characterize the component package, the parameters including dynamic response parameters that characterize a thermal dynamic response of the component package.

11. The oscillator component of claim 10 where the temperature compensation model is:

$$\text{frequency} = (a_0 + a_1 T + a_2 T^2 + a_3 T^3 + a_4 T^4 + \ldots + a_n T^n) + \{(b_{1,0} + b_{1,1} T + b_{1,2} T^2 + b_{1,3} T^3 + b_{1,4} T^4 + \ldots + b_{1,x} T^x)^* (b_{2,0} + b_{2,1} R + \ldots + b_{2,y} R^y)\}$$

where, T=temperature, R=filtered temperature ramp rate, and $a_n$, $b_{1,x}$, $b_{2,y}$, are coefficients calculated by curvefitting frequency and temperature data acquired while subjecting the component package to a temperature test profile; and where the plurality of parameters include the coefficients.

12. The oscillator component of claim 10 where the temperature compensation model is:

$$\text{frequency} = (a_0 + a_1 T + a_2 T^2 + a_3 T^3 + a_4 T^4 + \ldots + a_n T^n) + \{(b_{1,0} + b_{1,1} T + b_{1,2} T^2 + b_{1,3} T^3 + b_{1,4} T^4 + \ldots + b_{1,x} T^x)^* (b_{2,0} + b_{2,1} R + \ldots + b_{2,y} R^y)\} + (c_0 + c_1 T_f + \ldots c_m T_f^m)$$

where, T=temperature, R=filtered temperature ramp rate, $T_f$=filtered temperature, and $a_n$, $b_{1,x}$, $b_{2,y}$, and $c_m$ are coefficients calculated by curvefitting frequency and temperature data acquired while subjecting the component package to a temperature test profile; and where the plurality of parameters include the coefficients.

13. The oscillator component of claim 10 where:
n=9;
x=5;
y=2; and
m=1.

14. The oscillator component of claim 10 where the temperature sensing device includes a temperature sensor that outputs a voltage level that varies as a function of temperature.

15. The oscillator component of claim 14 further comprising an analog-to-digital converter ("ADC") coupled to the temperature sensor to receive the voltage level.

16. The oscillator component of claim 10 where the temperature sensing device includes a second oscillator that generates a second signal having a second frequency that varies linearly with temperature.

17. The oscillator component of claim 10 where the component package further comprises a parameter memory for storing the plurality of parameters.

18. A device comprising:
a plurality of electronic components to perform a function that uses a signal having a frequency;
a oscillator circuit in a component package that includes a temperature sensing device located in substantially close proximity to the oscillator circuit, where the oscillator circuit generates the frequency used to perform the function, the frequency varying as a function of temperature characterized by a temperature compensation model associated with a plurality of parameters that characterize the component package, the parameters including dynamic response parameters that characterize a thermal dynamic response of the component package;
a parameter memory for storing the plurality of parameters; and
a frequency correction function coupled to the oscillator component to receive the frequency and to receive a signal indicative of the temperature from the temperature sensing device, the frequency correction function being operable to receive at least some of the plurality of parameters and to perform the temperature compensation model using the plurality of parameters.

19. The device of claim 18 where the temperature compensation model is:

$$\text{frequency} = (a_0 + a_1 T + a_2 T^2 + a_3 T^3 + a_4 T^4 + \ldots + a_n T^n) + \{(b_{1,0} + b_{1,1} T + b_{1,2} T^2 + b_{1,3} T^3 + b_{1,4} T^4 + \ldots + b_{1,x} T^x)^* (b_{2,0} + b_{2,1} R + \ldots + b_{2,y} R^y)\}$$

where, T=temperature, R=filtered temperature ramp rate, and $a_n$, $b_{1,x}$, $b_{2,y}$, are coefficients calculated by curvefitting frequency and temperature data acquired while subjecting the component package to a temperature test profile; and where the plurality of parameters include the coefficients.

20. The device of claim 18 where the temperature compensation model is:

$$\text{frequency} = (a_0 + a_1 T + a_2 T^2 + a_3 T^3 + a_4 T^4 + \ldots + a_n T^n) + \{(b_{1,0} + b_{1,1} T + b_{1,2} T^2 + b_{1,3} T^3 + b_{1,4} T^4 + \ldots + b_{1,x} T^x)^* (b_{2,0} + b_{2,1} R + \ldots + b_{2,y} R^y)\} + (c_0 + c_1 T_f + \ldots c_m T_f^m)$$

where, T=temperature, R=filtered temperature ramp rate, $T_f$=filtered temperature, and $a_n$, $b_{1,x}$, $b_{2,y}$, and $c_m$ are coefficients calculated by curvefitting frequency and temperature data acquired while subjecting the component package to a temperature test profile; and where the plurality of parameters include the coefficients.

21. The device of claim 18 where:
the temperature sensing device includes a temperature sensor that outputs a voltage level that varies as a function of temperature; and
the temperature sensor is connected to an analog-to-digital converter ("ADC") to generate the signal indicative of the temperature.

22. The device of claim 21 where the ADC is located inside the component package.

23. The device of claim 18 where the temperature sensing device includes a second oscillator that generates a second signal having a second frequency that varies linearly with temperature; and the device includes a frequency counter to receive the second frequency and output the signal indicative of the temperature.

24. The device of claim 18 where the component package further comprises a parameter memory for storing the plurality of parameters.

25. A system for configuring a oscillator component for generating a temperature corrected frequency, the system comprising:
a temperature sensor and a oscillator circuit included in the oscillator component;
a temperature controlled chamber containing the oscillator component, the temperature controlled chamber controllable to subject the oscillator component to a temperature that varies according to a temperature test profile; and
a temperature correction modeling function coupled to the oscillator component to receive an uncompensated frequency signal and a temperature signal indicative of the temperature of the oscillator component, the temperature correction modeling function operable to model the oscillator component a temperature compensation model associated with a plurality of parameters that characterize the component package, the parameters including dynamic response parameters that characterize a thermal dynamic response of the component package, the temperature compensation modeling function being operable to generate the plurality of parameters:

$$\text{frequency} = (a_0 + a_1 T + a_2 T^2 + a_3 T^3 + a_4 T^4 + \ldots + a_n T^n) + \{(b_{1,0} + b_{1,1} T + b_{1,2} T^2 + b_{1,3} T^3 + b_{1,4} T^4 + \ldots + b_{1,x} T^x)^* (b_{2,0} + b_{2,1} R + \ldots + b_{2,y} R^y)\} + (c_0 + c_1 T_f + \ldots c_m T_f^m)$$

where, T=temperature, R=filtered temperature ramp rate, $T_f$=filtered temperature, and $a_n$, $b_{i,x}$, $b_{2,y}$, and $c_m$ are coefficients calculated by curvefitting frequency and temperature data acquired while subjecting the component package to a temperature test profile, the temperature correction modeling function further operable to associate the coefficients to the oscillator component.

26. The system of claim 25 where the temperature compensation model is:

$$\text{frequency} = (a_0 + a_1 T + a_2 T^2 + a_3 T^3 + a_4 T^4 + \ldots + a_n T^n) + \{(b_{1,0} + b_{1,1} T + b_{1,2} T^2 + b_{1,3} T^3 + b_{1,4} T^4 + \ldots + b_{1,x} T^x)^* (b_{2,0} + b_{2,1} R + \ldots + b_{2,y} R^y)\}$$

where, T=temperature, R=filtered temperature ramp rate, and $a_n$, $b_{1,x}$, $b_{2,y}$, are coefficients calculated by curvefitting frequency and temperature data acquired while subjecting the component package to a temperature test profile; and where the plurality of parameters include the coefficients.

27. The system of claim 25 where the temperature compensation model is:

$$\text{frequency} = (a_0 + a_1 T + a_2 T^2 + a_3 T^3 + a_4 T^4 + \ldots + a_n T^n) + \{(b_{1,0} + b_{1,1} T + b_{1,2} T^2 + b_{1,3} T^3 + b_{1,4} T^4 + \ldots + b_{1,x} T^x) * (b_{2,0} + b_{2,1} R + \ldots + b_{2,y} R^y)\} + (c_0 + c_1 T_f + \ldots c_m T_f^m)$$

where, T=temperature, R=filtered temperature ramp rate, $T_f$=filtered temperature, and $a_n$, $b_{1,x}$, $b_{2,y}$, and $c_m$ are coefficients calculated by curvefitting frequency and temperature data acquired while subjecting the component package to a temperature test profile; and where the plurality of parameters include the coefficients.

* * * * *